United States Patent
Fukuhara et al.

(10) Patent No.: US 7,308,757 B2
(45) Date of Patent: Dec. 18, 2007

(54) INTERMEDIATE PRODUCT MANUFACTURING APPARATUS, AND INTERMEDIATE PRODUCT MANUFACTURING METHOD

(75) Inventors: Keiji Fukuhara, Eniwa (JP); Yasutsugu Aoki, Kofu (JP); Yoshitake Kobayashi, Shiojiri (JP); Hisashi Fujimura, Chino (JP)

(73) Assignee: Seiko Epson Corporation (JP)

( * ) Notice: Subject to any disclaimer, the term of this patent is extended or adjusted under 35 U.S.C. 154(b) by 247 days.

(21) Appl. No.: 10/794,778

(22) Filed: Mar. 5, 2004

(65) Prior Publication Data

US 2004/0231146 A1    Nov. 25, 2004

(30) Foreign Application Priority Data

Mar. 10, 2003 (JP) ............................. 2003-063785

(51) Int. Cl.
*H01L 21/673* (2006.01)
*H01L 21/677* (2006.01)

(52) U.S. Cl. ........................... 29/742; 29/729; 29/759; 198/465.2; 198/580

(58) Field of Classification Search .................. 29/729, 29/771, 739–743, 759–761, 783–786, 791–794, 29/822–824; 198/465.2, 580, 803.14; 414/940, 414/935–941; 451/65–72
See application file for complete search history.

(56) References Cited

U.S. PATENT DOCUMENTS

| | | | | |
|---|---|---|---|---|
| 2,896,314 A | * | 7/1959 | Godwin et al. ............... | 227/99 |
| 4,550,239 A | * | 10/1985 | Uehara et al. ......... | 219/121.43 |
| 5,329,690 A | * | 7/1994 | Tsuji et al. .................... | 29/701 |
| 5,411,358 A | * | 5/1995 | Garric et al. ................ | 414/227 |
| 6,239,859 B1 | * | 5/2001 | Park ............................ | 355/27 |
| 6,821,082 B2 | * | 11/2004 | McGowan .................. | 414/805 |

FOREIGN PATENT DOCUMENTS

| | | |
|---|---|---|
| JP | 62-48038 | 3/1987 |
| JP | 63-139811 | 6/1988 |
| JP | 2-78243 | 3/1990 |
| JP | 2-117512 | 5/1990 |
| JP | 04-352343 | 12/1992 |

(Continued)

OTHER PUBLICATIONS

Patent Abstracts of Japan regarding Publication No. 62-048038, published Mar. 2, 1987.

(Continued)

*Primary Examiner*—Peter Vo
*Assistant Examiner*—Livius R. Cazan
(74) *Attorney, Agent, or Firm*—Harness, Dickey & Pierce, P.L.C.

(57) ABSTRACT

An intermediate product manufacturing apparatus for carrying intermediate products and processing the intermediate products with a plurality of processing apparatuses is provided, the apparatus comprising: a plurality of carrying means for carrying the intermediate products to the processing apparatuses; a common processing apparatus provided between the plurality of carrying means, for carrying out a common process on the intermediate products carried by the carrying means; and intermediate product transfer sections provided between the plurality of carrying means, for transferring the intermediate products between the common processing apparatus and the carrying means.

5 Claims, 12 Drawing Sheets

FIRST EMBODIMENT

FOREIGN PATENT DOCUMENTS

| | | |
|---|---|---|
| JP | 6-310424 | 11/1994 |
| JP | 2001-233450 | 8/2001 |
| JP | 2001-315960 | 11/2001 |
| JP | 2001-338968 | 12/2001 |
| JP | 2002-237512 | 8/2002 |
| JP | 2002-334917 | 11/2002 |
| JP | 2002334917 A * | 11/2002 |

OTHER PUBLICATIONS

Patent Abstracts of Japan regarding Publication No. 02-078243, published Mar. 19, 1990.

Patent Abstracts of Japan regarding Publication No. 02-117512, published May 2, 1990.

Patent Abstracts of Japan regarding Publication No. 06-310424, published Nov. 4, 1994.

Patent Abstracts of Japan regarding Publication No. 2001-338968, published Dec. 7, 2001.

Patent Abstracts of Japan regarding Publication No. 2002-237512, published Aug. 23, 2002.

Patent Abstracts of Japan regarding Publication No. 2002-334917, published Nov. 22, 2002.

* cited by examiner

INTERMEDIATE PRODUCT MANUFACTURING APPARATUS, AND INTERMEDIATE PRODUCT MANUFACTURING METHOD

RELATED APPLICATIONS

This application claims priority to Japanese Patent Application No. 2003-063785 filed Mar. 10, 2003 which is hereby expressly incorporated by reference herein in its entirety.

BACKGROUND OF THE INVENTION

1. Technical Field of the Invention

The present invention relates to an intermediate product manufacturing apparatus and an intermediate product manufacturing method for manufacturing intermediate products such as semiconductor wafers.

2. Description of the Related Art

Semiconductor processing apparatuses for manufacturing semiconductor wafers (hereinafter, referred to as wafers) include a variety of wafer processing apparatuses such as lithography apparatuses, film forming apparatuses, etching apparatuses, cleaning apparatuses, inspection apparatuses, etc.

Wafer cassettes are used for moving the wafers among the wafer processing apparatuses. The wafer cassettes detachably receive a plurality of wafers. A plurality of wafers corresponding to lots required by a process carrying system are housed in the wafer cassettes (for example, see Japanese Unexamined Patent Application Publication No. 62-48038 (see page 2 and FIG. 1)).

On the other hand, from the requirement for limited production of a wide variety of wafers, a so-called single wafer carrying method of carrying wafers on a conveyer one by one in place of carrying the wafers in wafer cassettes has been disclosed. This single wafer carrying method is intended to cope with the limited production of a variety of wafers (for example, see Japanese Unexamined Patent Application Publication No. 2002-334917 (see page 1 and FIG. 1)).

When the single wafer carrying method is employed, the following problems are caused.

One single wafer carrying conveyer is provided correspondingly to a plurality of processing apparatuses. That is, the single wafer carrying conveyer supplies the wafers to the respective processing apparatuses by using a single wafer carrying method. The single wafer carrying conveyer and the plurality of processing apparatuses constitute one process system.

Another process system is provided adjacent thereto. This process system is also provided with a single wafer carrying conveyer and a plurality of processing apparatuses. In a manufacturing system in which multiple process systems are arranged, a processing apparatus having the same processing function may exist in each adjacent process system.

Such a processing apparatus is, for example, a film thickness inspecting apparatus. The film thickness inspecting apparatus has a high film thickness inspection processing capacity, so that one film thickness inspecting apparatus can perform the film thickness inspection processing of all of the wafers in two adjacent process systems.

Therefore, processing apparatuses such as CVD (Chemical Vapor Deposition) apparatuses having a relatively low processing capacity, and apparatuses such as film thickness inspecting apparatuses having a relatively high processing capacity are repeatedly arranged in the single wafer carrying conveyers of the process systems. Since the number of apparatuses is large, the capital investment is increased.

When it is intended to transfer a wafer from one single wafer carrying conveyer to another single wafer carrying conveyer, the wafer is temporarily stored in a wafer cassette. The cassette is transferred to the next process system by using an inter-process carrying conveyer. The wafer is taken out of the cassette, and then the wafer should be transferred to the single wafer carrying conveyer of the next process system. For this reason, much time is required for taking in and out the wafers. Therefore, wafer manufacturing time cannot be reduced by sharing high volume processing apparatuses among more than one process system.

Therefore, the present invention is contrived to solve the above problems, and it is thus an object of the present invention to provide an intermediate product manufacturing apparatus and an intermediate product manufacturing method, capable of reducing the manufacturing time for intermediate products such as semiconductor wafers, and accomplishing miniaturization of the intermediate product manufacturing apparatus by allowing adjacent process systems to share an apparatus having a relatively high processing capacity.

SUMMARY

According to an aspect of the present invention, there is provided an intermediate product manufacturing apparatus for carrying intermediate products and processing the intermediate products by means of a plurality of processing apparatuses, the apparatus comprising: a plurality of carrying means (carriers) for carrying the intermediate products to the processing apparatuses; a common processing apparatus provided between the plurality of carrying means, for carrying out a common process on the intermediate products carried by the carrying means; and intermediate product transfer sections provided between the plurality of carrying means, for transferring the intermediate products between the common processing apparatus and the carrying means.

According to this construction, the plurality of carrying means carry the intermediate products to the processing apparatuses. The common processing apparatus is provided between the plurality of carrying means. The common processing apparatus can perform a common process on the intermediate products carried by the respective carrying means.

The intermediate product transfer sections are provided between the plurality of carrying means. The intermediate product transfer sections transfer the intermediate products between the common processing apparatus and the respective carrying means.

Accordingly, the common processing apparatus is provided between the plurality of carrying means, and in addition can perform a common process on the intermediate products from the respective carrying means.

Therefore, by arranging an apparatus having a relatively high processing capacity as the common processing apparatus, the intermediate products carried by the plurality of carrying means can be efficiently processed in common, so that it is possible to reduce the manufacturing time.

Furthermore, since the common processing apparatus for performing a common process is provided between the respective carrying means, it is possible to accomplish miniaturization of the manufacturing apparatus, compared with a case where a high-speed processing apparatus is provided for each of the carrying means.

In the above construction, it is preferable that the carrying means are single wafer carrying conveyers for carrying the intermediate products in a single wafer state, the plurality of single wafer carrying conveyers include a first single wafer carrying conveyer and a second single wafer carrying conveyer arranged to be parallel to the first single wafer carrying conveyer, and the intermediate product transfer sections are provided at a first position between the common processing apparatus and the first single wafer carrying conveyer, and at a second position between the common processing apparatus and the second single wafer carrying conveyer, respectively.

According to this construction, the plurality of single wafer carrying conveyers include the first single wafer carrying conveyer and the second single wafer carrying conveyer. The intermediate product transfer sections are provided at the first position and the second position, respectively. The first position is located between the common processing apparatus and the first single wafer carrying conveyer. The second position is located between the common processing apparatus and the second single wafer carrying conveyer.

As a result, the intermediate product transfer sections can efficiently transfer the intermediate products between the common processing apparatus and the first single wafer carrying conveyer, and between the common processing apparatus and the second single wafer carrying conveyer, so that it is possible to reduce the manufacturing time.

In the above construction, it is preferable that the carrying means are single wafer carrying conveyers for carrying the intermediate products in a single wafer state, the plurality of single wafer carrying conveyers include a first single wafer carrying conveyer and a second single wafer carrying conveyer arranged to be parallel to the first single wafer carrying conveyer, and the intermediate product transfer section is provided between the first single wafer carrying conveyer and the second single wafer carrying conveyer, and the common processing apparatus faces the intermediate product transfer section.

According to this construction, the plurality of single wafer carrying conveyers include the first single wafer carrying conveyer and the second single wafer carrying conveyer.

The intermediate product transfer section is provided between the first single wafer carrying conveyer and the second single wafer carrying conveyer. The common processing apparatus faces the intermediate product transfer section.

As a result, the intermediate product transfer section can efficiently transfer the intermediate products between the common processing apparatus and the first single wafer carrying conveyer, and between the common processing apparatus and the second single wafer carrying conveyer, so that it is possible to reduce the manufacturing time.

In the above construction, it is preferable that the carrying means are single wafer carrying conveyers for carrying the intermediate products in a single wafer state, the plurality of single wafer carrying conveyers include a first single wafer carrying conveyer and a second single wafer carrying conveyer arranged to be parallel to the first single wafer carrying conveyer, and the intermediate product section comprises: a third single wafer carrying conveyer provided between the first single wafer carrying conveyer and the second single wafer carrying conveyer, for carrying the intermediate products in a single wafer state; and a transfer apparatus for transferring the intermediate products coming from the first single wafer carrying conveyer between the third single wafer carrying conveyer and the common processing apparatus, and transferring the intermediate products between the second single wafer carrying conveyer and the common processing apparatus.

According to this construction, the plurality of single wafer carrying conveyers include the first single wafer carrying conveyer and the second single wafer carrying conveyer.

The third single wafer carrying conveyer of the intermediate product transfer section is provided between the first single wafer carrying conveyer and the second single wafer carrying conveyer. The transfer apparatus transfers the intermediate products coming from the first single wafer carrying conveyer between the third single wafer carrying conveyer and the common processing apparatus. Furthermore, the transfer unit can transfer the intermediate products between the second single wafer carrying conveyer and the common processing apparatus.

As a result, the intermediate products can be efficiently transferred between the first single wafer carrying conveyer and the common processing apparatus, and between the second single wafer carrying conveyer and the common processing apparatus, so that it is possible to reduce the manufacturing time.

In the above construction, it is preferable that the intermediate products are semiconductor wafers.

According to this construction, the intermediate products are semiconductor wafers, and thus it is possible to reduce the manufacturing time of the semiconductor wafers.

According to another aspect of the present invention, there is provided an intermediate product manufacturing method for carrying intermediate products and processing the intermediate products by means of a plurality of processing apparatuses, the method comprising: a carrying step in which the intermediate products are carried to the processing apparatuses through individual carrying means; a intermediate product transfer step in which an intermediate product transfer section provided between the plurality of carrying means transfers the intermediate products between a common processing apparatus and the carrying means; and a common processing step in which a common process is performed on the intermediate products carried by means of the carrying means to the common processing apparatus provided between the plurality of carrying means.

According to the above construction, in the single wafer carrying step, the intermediate products are carried to the processing apparatuses through the individual carrying means.

In the transfer step, the intermediate product transfer section provided between the plurality of carrying means can transfer the intermediate products between the common processing apparatus and the carrying means.

In the common processing step, a common process is performed on the intermediate products carried by means of the respective carrying means to the common processing apparatus provided between the plurality of carrying means.

Accordingly, the common processing apparatus is provided between the plurality of carrying means, and in addition can perform the common process on the intermediate products from the respective carrying means.

Therefore, by arranging an apparatus having a relatively high processing capacity as the common processing apparatus, the intermediate products carried by the plurality of carrying means can be efficiently processed by the common processing apparatus, so that it is possible to reduce the manufacturing time.

Furthermore, since the common processing apparatus for performing a common process is provided between the respective carrying means, it is possible to accomplish miniaturization of the manufacturing apparatus, compared with a case where a separate relatively high-speed processing apparatus is provided for each of the carrying means.

In the above construction, it is preferable that the carrying means are single wafer carrying conveyers for carrying the intermediate products in a single wafer state, and the intermediate products are semiconductor wafers.

According to this construction, the semiconductor wafers can be carried in a single wafer state, so that it is possible to reduce the manufacturing time for the semiconductor wafers.

DETAILED DESCRIPTION

Now, preferred embodiments of the present invention will be described with reference to the accompanying drawings.

Figure 1:
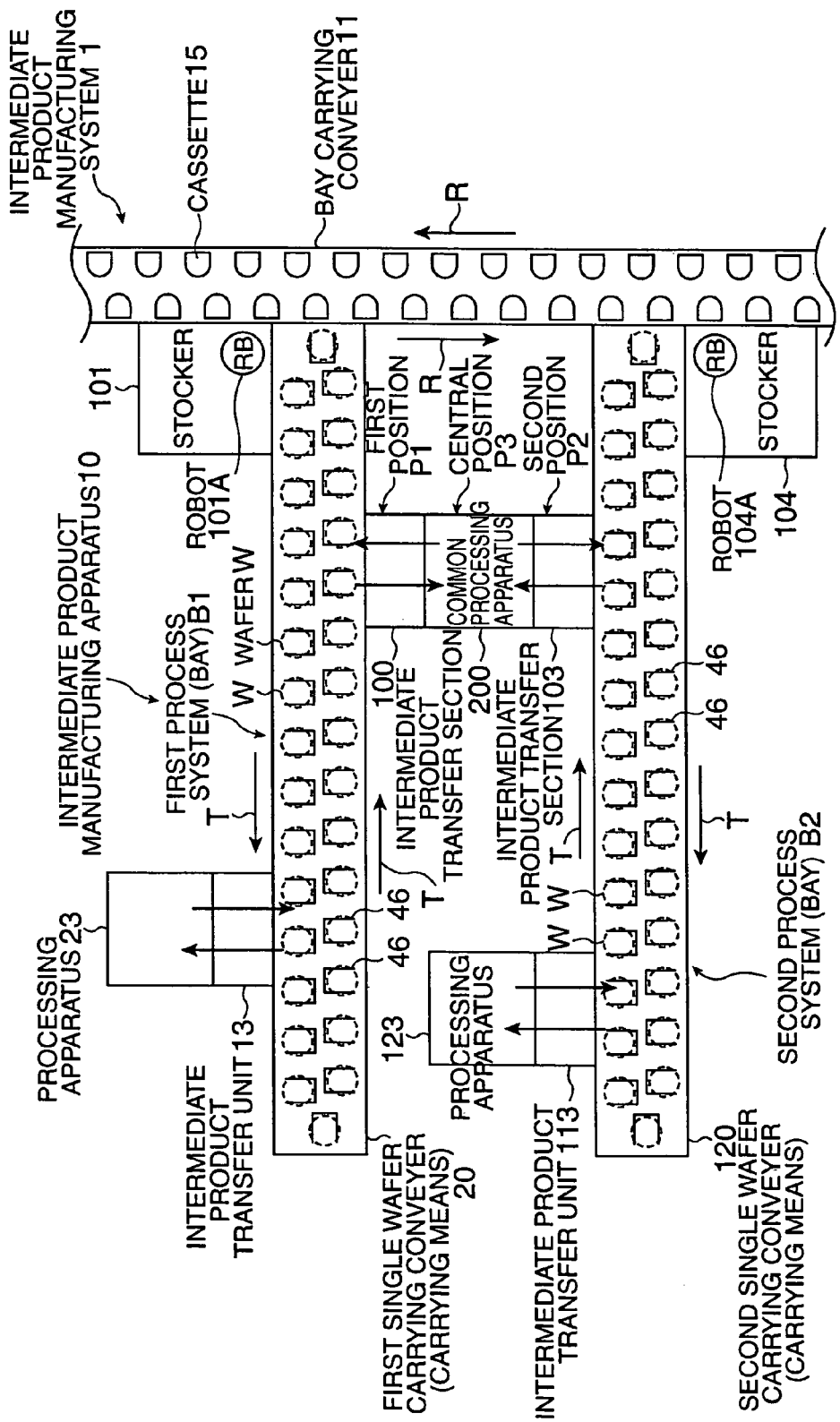
FIG. 1 is a plan view showing an intermediate product manufacturing system including a first embodiment of an intermediate product manufacturing apparatus according to the present invention.

FIG. 1 is a plan view showing an example of a part of an intermediate product manufacturing system including an intermediate product manufacturing apparatus according to the present invention. The intermediate product manufacturing system 1 has a plurality of intermediate manufacturing apparatuses 10. In FIG. 1, one intermediate product manufacturing apparatus 10 is shown as an example. The intermediate product manufacturing system 1 is a system for manufacturing semiconductor wafers W (hereinafter, referred to as 'wafers') as an example of an intermediate product.

FIRST EMBODIMENT

In FIG. 1, the intermediate product manufacturing system 1 has one intermediate product manufacturing apparatus 10 and one bay carrying conveyer 11. The bay carrying conveyer 11 is also known as an inter-process carrying conveyer. The bay carrying conveyer 11 can continuously carry, for example, a plurality of cassettes 15 shown in FIG. 2 in the direction indicated by R.

Figure 2:
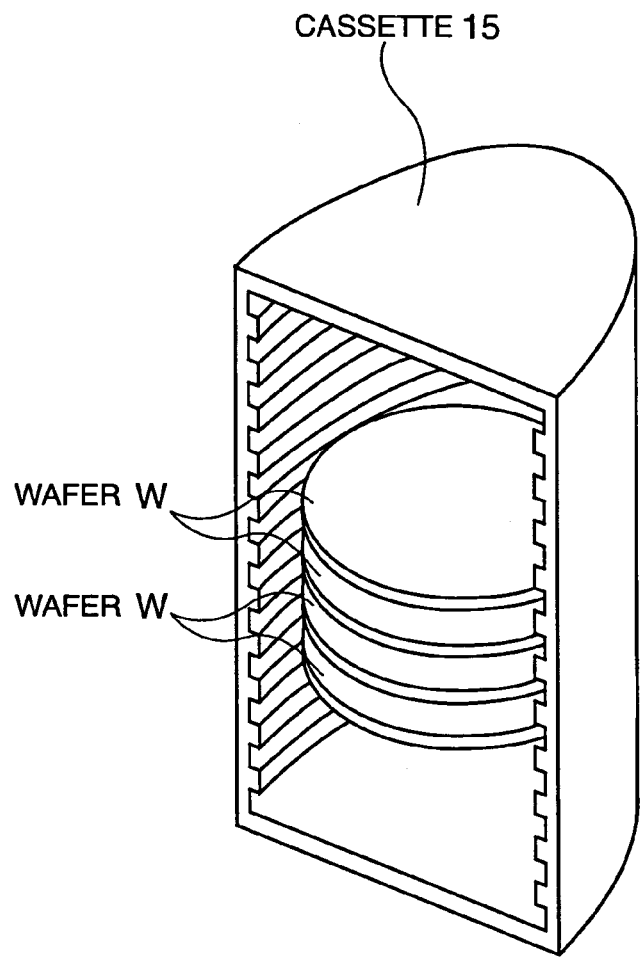
FIG. 2 is a perspective view showing an example of a cassette for housing a plurality of wafers.

An example of the cassette 15 is shown in FIG. 2, and the cassette 15 can detachably house a plurality of wafers W. It is preferable that the cassette 15 has sealing portions for sealing the wafers W. The plurality of cassettes 15 are carried between process systems by means of the bay carrying conveyer 11 shown in FIG. 1, and supplied to the next process system.

The intermediate product manufacturing apparatus 10 shown in FIG. 1 is provided to face the bay carrying conveyer 11. One intermediate product manufacturing apparatus 10 is shown in the example of FIG. 1, and the intermediate product manufacturing apparatus 10 is provided on one side of the bay carrying conveyer 11.

However, the process system is not limited to this configuration, as one or more intermediate product manufacturing apparatuses 10 may be provided on one side of the bay carrying conveyer 11, or on the other side thereof (not shown).

The intermediate product manufacturing apparatus 10 generally has a first process system B1, a second process system B2 and a common processing apparatus 200. The process system is also known as a bay.

The first process system B1 and the second process system B2 are arranged in parallel, and one end of the first process system B1 and one end of the second process system B2 are connected to the bay carrying conveyer 11.

The first process system B1 has a first single wafer carrying conveyer 20, a processing apparatus 23, an intermediate product transfer unit 13, an intermediate product transfer section 100, and a stocker 101 for the cassettes 15.

Likewise, the second process system B2 has a second single wafer carrying conveyer 120, a processing apparatus 123, an intermediate product transfer unit 113, an intermediate product transfer section 103, and a stocker 104 for the cassettes 15.

The first single wafer carrying conveyer 20 and the second single wafer carrying conveyer 120 shown in FIG. 1 are an example of the carrying means, and are conveyers for carrying the wafers in a single wafer state. The first single wafer carrying conveyer 20 and the second single wafer carrying conveyer 120 can continuously carry the wafers W in the carrying direction indicated by T. The first single wafer carrying conveyer 20 and the second single wafer carrying conveyer 120 have the same structure, and have a plurality of wafer holding units 46.

Figure 3:
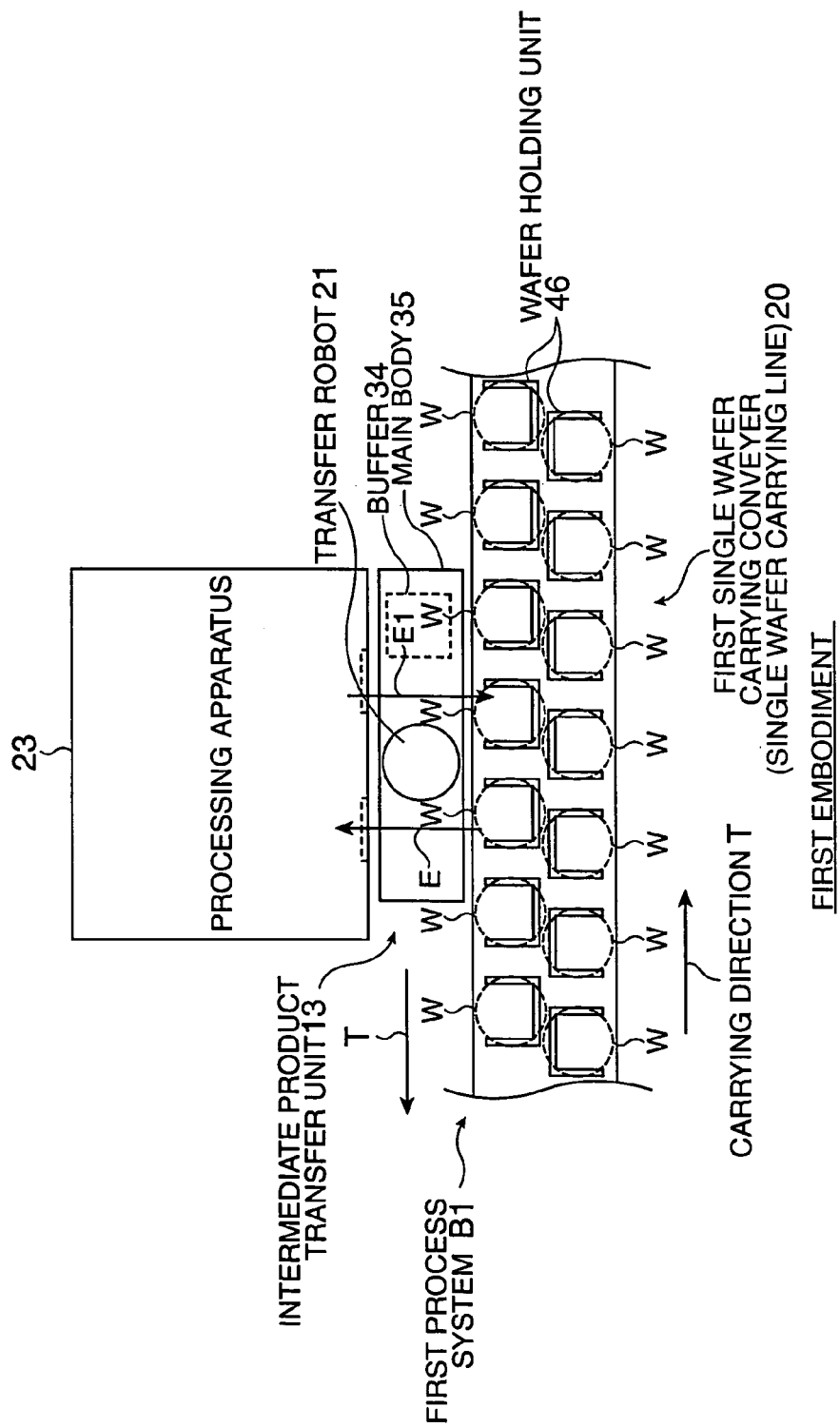
FIG. 3 is a plan view showing an intermediate product transfer unit, a first single wafer carrying conveyer and a processing apparatus of the first embodiment shown in FIG. 1.
Figure 4:
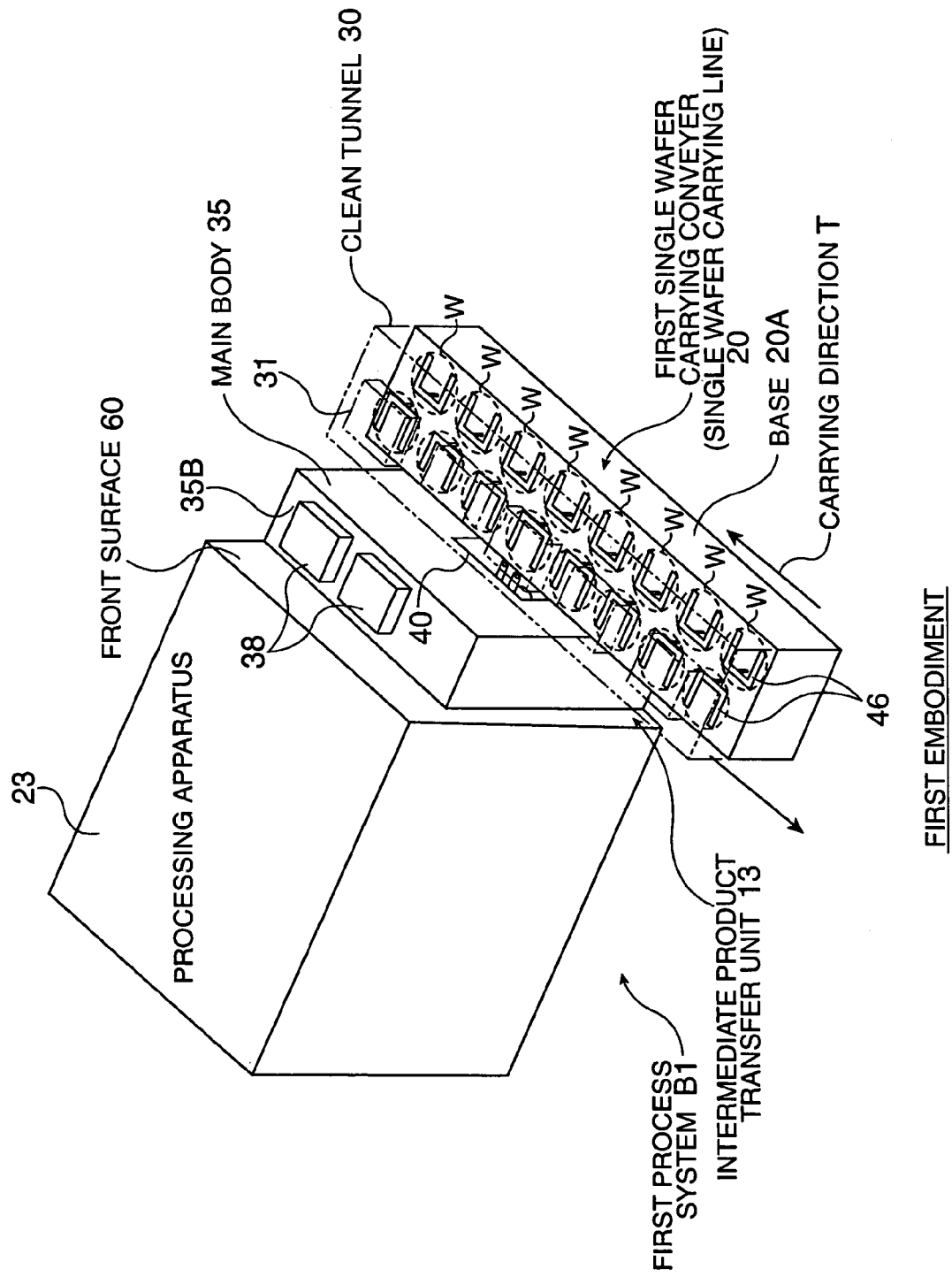
FIG. 4 is a perspective view showing some parts of the apparatus shown in FIG. 3.

FIG. 3 is a plan view showing the area of the first single wafer carrying conveyer 20, the intermediate product transfer unit 13 and the processing apparatus 23 of the first process system B1 shown in FIG. 1. FIG. 4 is a perspective view showing shapes of the first single wafer carrying conveyer 20, the intermediate product transfer unit 13, and the processing apparatus 23 shown in FIG. 3.

Figure 5:
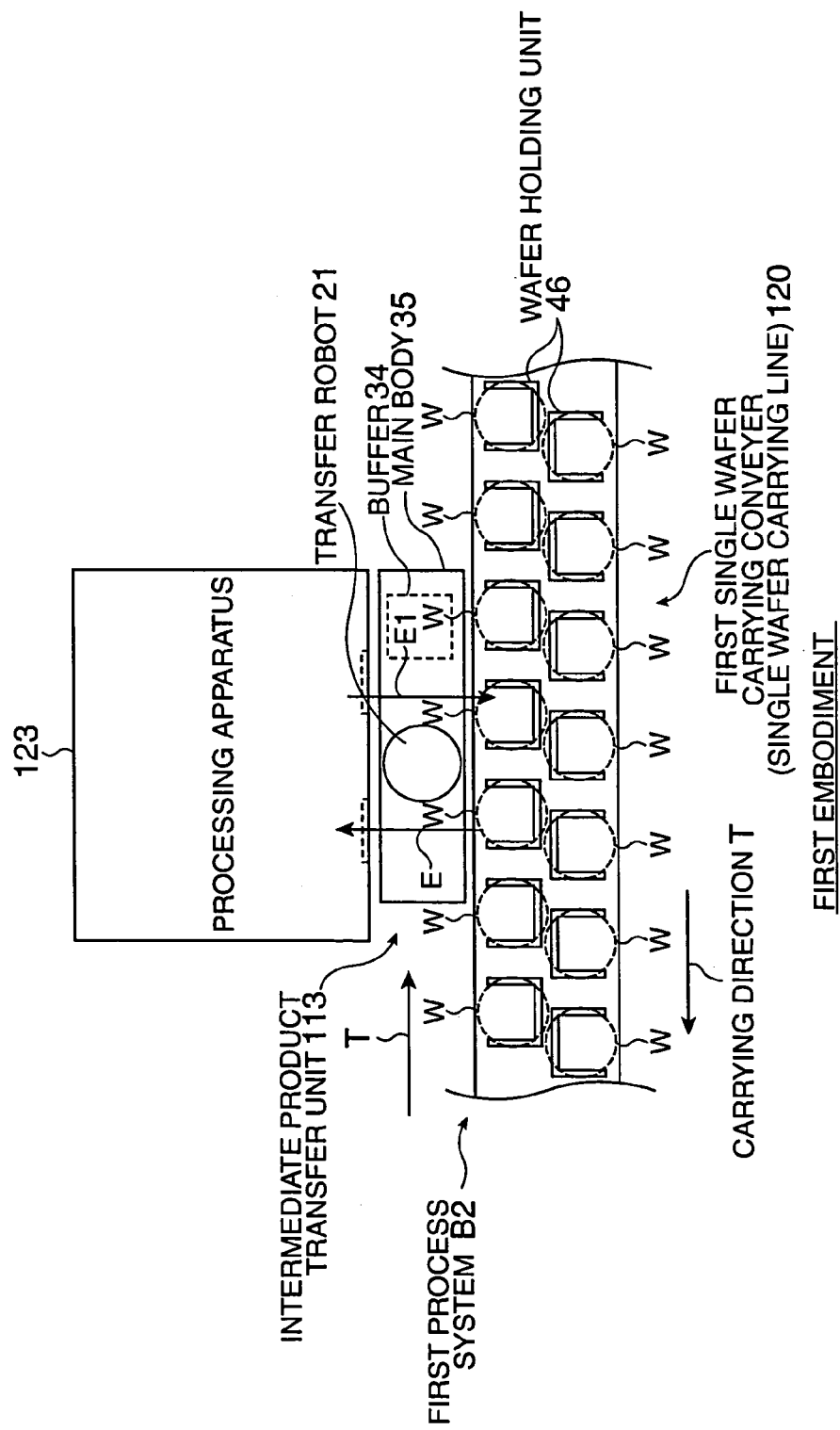
FIG. 5 is a plan view showing a second single wafer carrying conveyer, an intermediate product transfer unit and a processing apparatus of the first embodiment according to the present invention.

FIG. 5 illustrates the second single wafer carrying conveyer 120, the intermediate product transfer unit 113, and the processing apparatus 123 of the second process system B2 in FIG. 1.

The first single wafer carrying conveyer 20 and the second single wafer carrying conveyer 120 are also known as a single wafer carrying line.

The first single wafer carrying conveyer 20 and the second single wafer carrying conveyer 120 have the same structure. As shown in FIG. 4, the first single wafer carrying conveyer 20 includes a base 20A, and a plurality of wafer holding units 46 mounted on the base 20A.

The plurality of wafer holding units 46 are arranged continuously in the carrying direction indicated by T on the base 20A. Each wafer holding unit 46 is detachably loaded with, for example, one sheet of wafer W. The respective wafer holding units 46 are arranged at uniform intervals in the carrying direction indicated by T, and can be continuously moved in the carrying direction indicated by T by means of a driving unit not shown.

As shown in FIG. 4, a clean tunnel 30 is provided over the base 20A. An upper surface of the clean tunnel 30 is provided with a filter unit 31 to which fans are attached. The fan-attached filter unit 31 generates a downward air flow to enhance the cleanliness of an enclosed space formed inside the clean tunnel 30. As a result, dust in the air inside the clean tunnel 30 is removed to maintain a defined cleanliness level.

The clean tunnel 30 is provided in the second single wafer carrying conveyer 120 shown in FIG. 5 in addition to the first single wafer carrying conveyer 20 shown in FIG. 4.

The processing apparatus 23 shown in FIGS. 1 and 3 is, for example, a CVD (Chemical Vapor Deposition) apparatus. The processing apparatus 23 has a relatively low processing capacity for wafers W.

That is, the processing apparatus 23 is an apparatus which requires a relatively long time for processing each wafer W.

As shown in FIGS. 1 and 3, the intermediate product transfer unit 13 is provided between the processing apparatus 23 and the first single wafer carrying conveyer 20.

On the other hand, the processing apparatus 123 shown in FIGS. 1 and 5 is, for example, a CVD apparatus similar to the processing apparatus 23. The intermediate product transfer unit 113 is provided between the processing apparatus 123 and the second single wafer carrying conveyer 120.

Now, a structure of the intermediate product transfer unit 13 and the intermediate product transfer unit 113 will be described.

The intermediate product transfer unit 13 is shown in FIG. 3, and the intermediate product transfer unit 113 is shown in FIG. 5.

The intermediate product transfer unit 13 and the intermediate product transfer unit 113 may employ the same structure. Each intermediate product transfer unit 13, 113 has a transfer robot 21, a buffer 34 and a main body 35.

The main body 35 is provided between the processing apparatus 23 and the single wafer carrying conveyer 20. The main body 35 houses the transfer robot 21 and the buffer 34 described above.

As shown in FIG. 4, fan-attached filter units (FFU) 38 are provided on the main body 35. The main body 35 houses the transfer robot 21 and the buffer 34 in a very small enclosed space. The fan-attached filter units 38 generate a downward air flow from the top of the main body 35 to the bottom thereof within the space in the main body 35. As a result, dust in the air inside the main body 35 is removed to maintain the inside of the main body 35 at a defined cleanliness level (cleanliness class).

Next, the common processing apparatus 200 shown in FIG. 1 will be described.

The common processing apparatus 200 is an apparatus having a relatively high processing capacity, compared with the processing apparatus 23 and the processing apparatus 123. The common processing apparatus 200 may be, for example, a film thickness inspecting apparatus. The film thickness inspecting apparatus is to inspect the thickness of a film formed on the wafer W. The common processing apparatus 200 is provided at a central position P3 between the first position P1 of the first single wafer carrying conveyer 20 and the second position P2 of the second single wafer carrying conveyer 120.

The common processing apparatus 200 is an apparatus for inspecting the film thicknesses of the wafers W sent from the first single wafer carrying conveyer 20 and the wafers W from the second single wafer carrying conveyer 120, respectively.

Next, the intermediate product transfer sections 100, 103 shown in FIG. 1 will be described.

The intermediate product transfer sections 100, 103 can employ the same structure. The intermediate product transfer section 100 is provided at the first position P1. The intermediate product transfer section 103 is provided at the second position P2.

The first position P1 is a position between a side portion of the first single wafer carrying conveyer 20 and the central position P3. The second position P2 is a position between a side portion of the second single wafer carrying conveyer 120 and the central position P3.

The first single wafer carrying conveyer 20 and the second single wafer carrying conveyer 120 are arranged to be parallel to each other, but their carrying directions indicated by T are opposite to each other.

Figure 6:
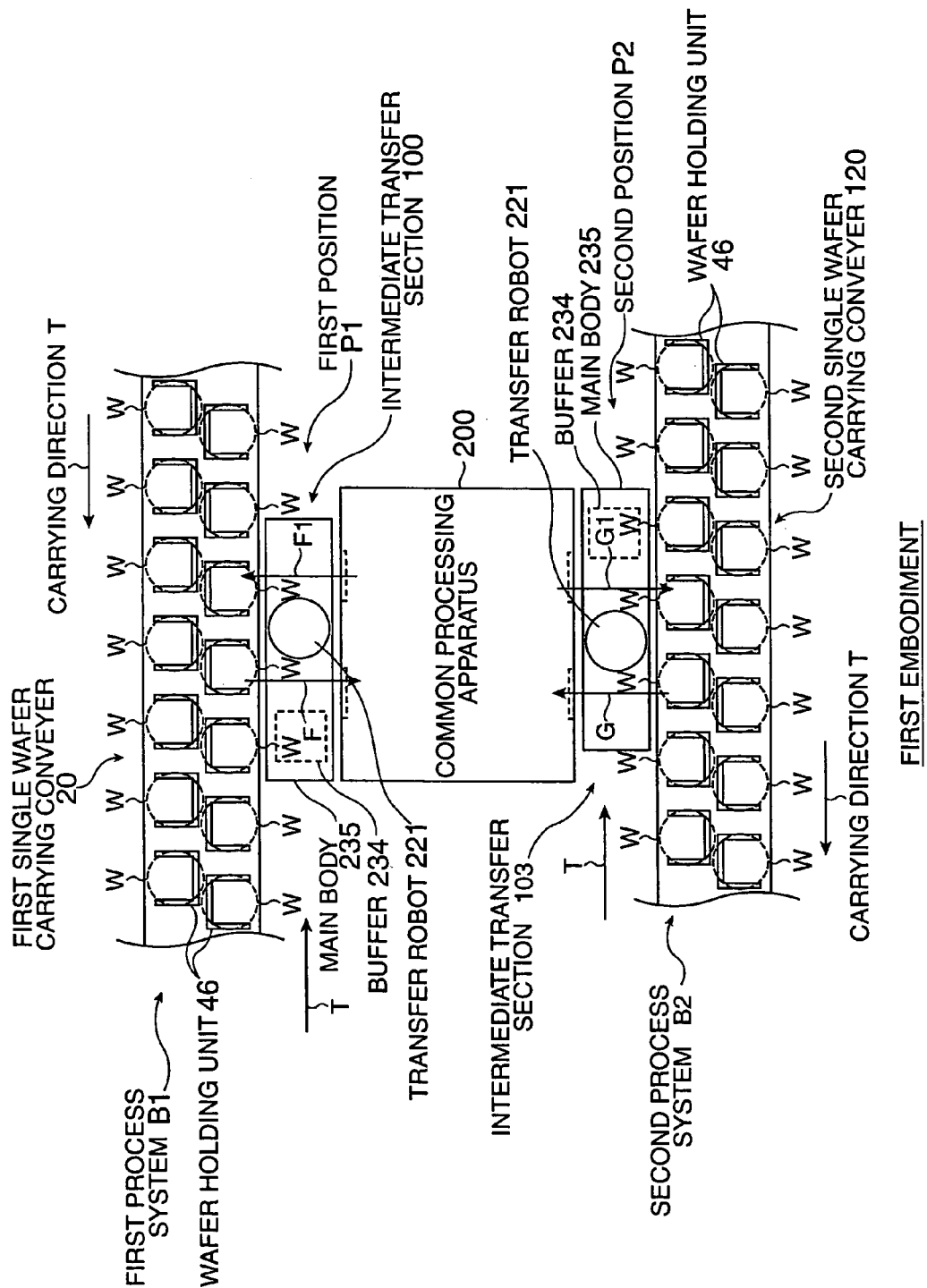
FIG. 6 is a plan view showing intermediate product transfer sections, a common processing apparatus and a plurality of single wafer carrying conveyers of the first embodiment shown in FIG. 1.

FIG. 6 is a plan view showing a structural example of the intermediate product transfer sections 100, 103, the common processing apparatus 200, the first single wafer carrying conveyer 20 and the second single wafer carrying conveyer 120.

The intermediate product transfer section 100 and the intermediate product transfer section 103 have the same structure. The intermediate product transfer section 100 has a transfer robot 221, a buffer 234 and a main body 235.

The main bodies 235 are provided between the common processing apparatus 200 and the first single wafer carrying conveyer 20, and between the common processing apparatus 200 and the second single wafer carrying conveyer 120, respectively. The main body 235 houses the transfer robot 221 and the buffer 234.

As shown in FIG. 4, a fan-attached filter unit (FFU) (not shown) is provided on the main body 235. The main body 235 houses a transfer robot 221 and a buffer 234 in a very small enclosed space. The fan-attached filter unit generates a downward air flow from the top of the main body 235 to the bottom thereof within the space in the main body 235. As a result, dust in the air inside the main body 235 is removed to maintain the inside of the main body 235 at defined cleanliness level (cleanliness class).

The intermediate product transfer section 100 is an apparatus for transferring the wafers W between the first single wafer carrying conveyer 20 and the common processing apparatus 200. The intermediate product transfer section 103 is an apparatus for transferring the wafers W between the second single wafer carrying conveyer 120 and the common processing apparatus 200.

Next, the stockers 101, 104 shown in FIG. 1 will be described.

The stockers 101, 104 are arranged corresponding to the first single wafer carrying conveyer 20 and the second single wafer carrying conveyer 120, respectively. The stocker 101 takes in the cassette 15 carried by means of the bay carrying conveyer 11 by using a robot 101A. The robot 101A takes the wafers W out of the cassette 15, and transfers the wafers to the wafer holding units 46 of the first single wafer carrying conveyer 20. The robot 101A stores the processed wafers W carried by means of the first single wafer carrying conveyer 20 in the cassette 15 in the stocker 101. The cassette 15 in which necessary wafers W are stored can be restored from the stocker 101 to the bay carrying conveyer 11 by means of the robot 101A.

The stocker 104 has the same structure as the stocker 101, and the stocker 104 has a robot 104A. The stocker 104 performs the same function as the stocker 101 for its respective process system.

Figure 7:
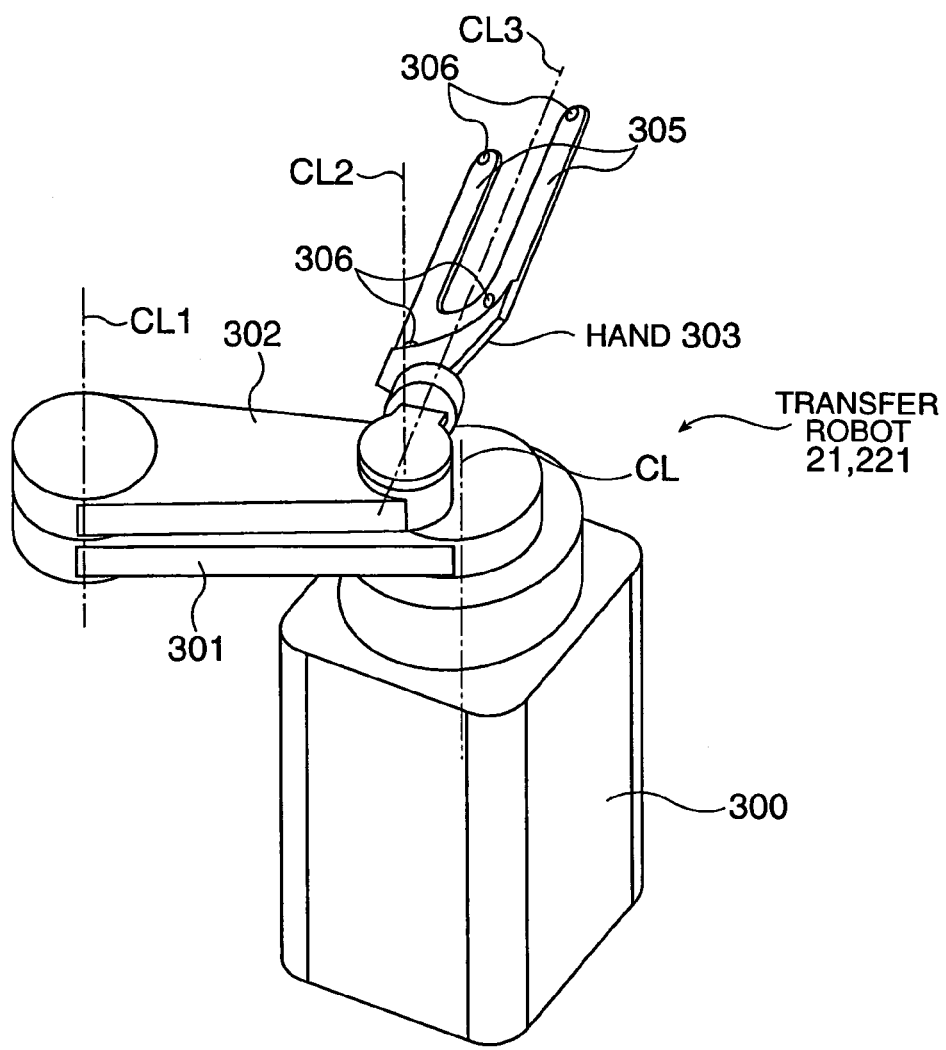
FIG. 7 is a perspective view showing an example of a transfer robot.
Figure 8:
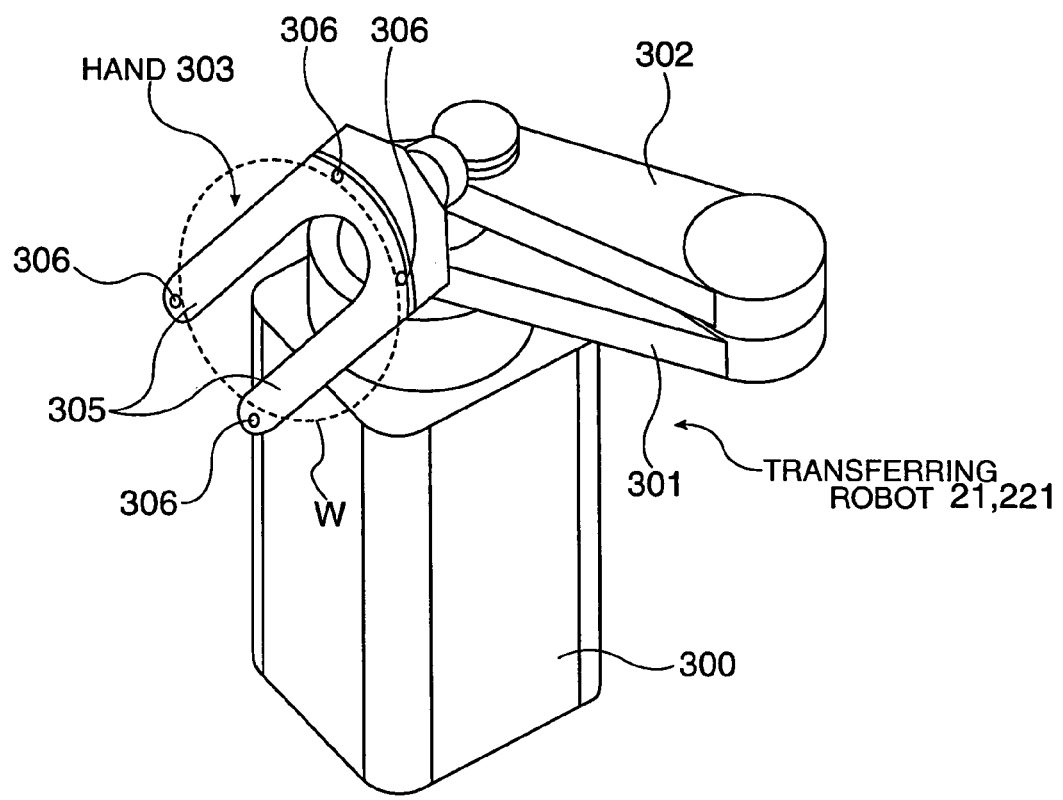
FIG. 8 is a perspective view of the transfer robot of FIG. 7 as seen from another angle.

FIGS. 7 and 8 show structural examples of the transfer robot 21 shown in FIG. 3, the transfer robot 21 shown in FIG. 5, and the transfer robot 221 shown in FIG. 6 described above.

The transfer robot 21 shown in FIG. 3 is a robot for transferring the wafers W, which are the intermediate products, in the directions indicated by arrows E, E1 between the first single wafer carrying conveyer 20 and the processing apparatus 23. The transfer robot 21 shown in FIG. 5 is a robot for transferring the wafers W in the directions indicated by arrows E, E1 between the second single wafer carrying conveyer 120 and the processing apparatus 123.

The transfer robot 221 shown in FIG. 6 is a robot for transferring the wafers W in the directions indicated by arrows F, F1 between the first single wafer carrying conveyer 20 and the common processing apparatus 200. Another transfer robot 221 shown in FIG. 6 is a robot for transferring the wafers W in the directions indicated by arrows G, G1, between the second single wafer carrying conveyer 120 and the common processing apparatus 200.

The transfer robots 21, 221 shown in detail in FIGS. 7 and 8 have a main body 300, a first arm 301, a second arm 302, and a hand 303, respectively. The first arm 301 can rotate about a central axis CL of the main body 300. The second arm 302 can rotate about a rotary axis CL1 of the first arm 301. The hand 303 can rotate about a rotary axis CL2 and also about a rotary axis CL3.

The hand 303 has substantially U-shaped arm portions 305, 305. The arm portions 305, 305 have support portions 306 for gripping the outer circumferential edge of a wafer W.

Next, referring to FIG. 9, an example of an intermediate product manufacturing method by employing the intermediate product manufacturing apparatus 10 shown in FIG. 1 will be described.

Figure 9:
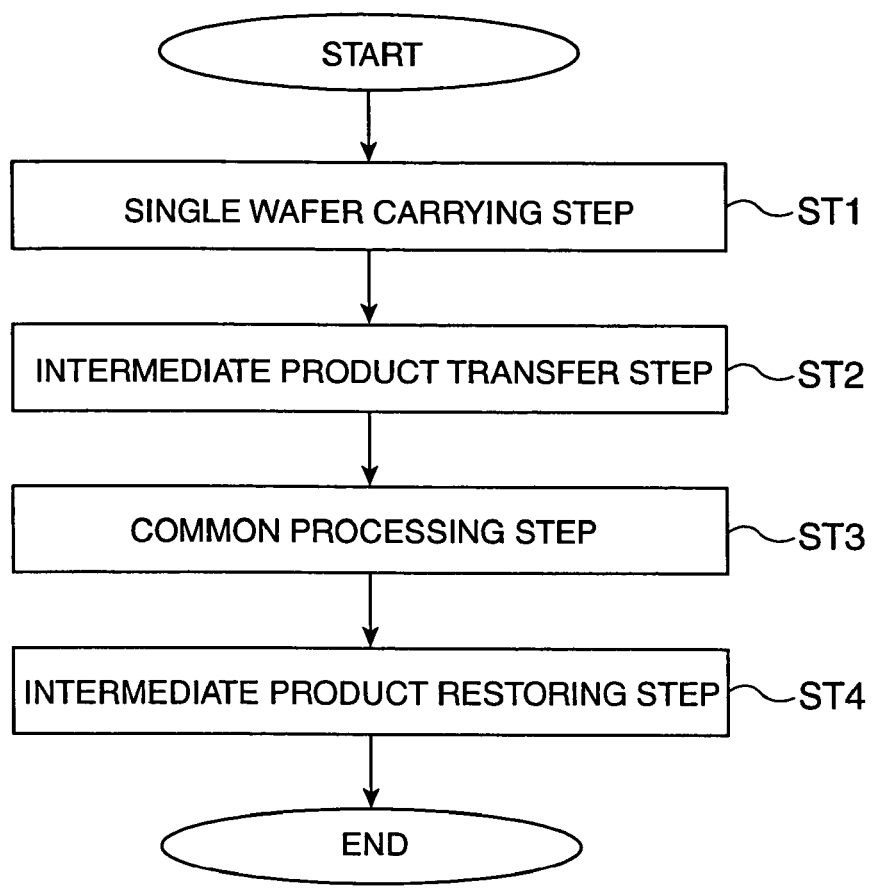
FIG. 9 is a flowchart showing an example of an intermediate product manufacturing method according to the present invention.

In a single wafer carrying step ST1 shown in FIG. 9, the cassette 15 carried by means of the bay carrying conveyer 11 is taken in the stocker 101 by the robot 101A of the stocker 101. The robot 101A transfers the wafers W within the cassette 15 to the wafer holding units 46 of the first single wafer carrying conveyer 20.

The first single wafer carrying conveyer 20 carries the wafers W to the intermediate product transfer unit 13 in the carrying direction indicated by T using the wafer holding units 46.

The carried wafers W are transferred to the processing apparatus 23 by means of the intermediate product transfer unit 13 shown in FIG. 1. As shown in FIG. 3, the wafers W are taken into the processing apparatus 23 along the direction indicated by E by means of the transfer robot 21.

Then, the processing apparatus 23 performs a necessary process on the wafers W, and then the transfer robot 21 restores the wafers W to the wafer holding units 46 along the direction indicated by E1.

In this case, for example, when the processing apparatus 23 cannot take in the wafers W, the wafers W are temporarily stored in the buffer 34. When the wafers W which have processed by the processing apparatus 23 cannot be transferred to the wafer holding units 46, for example, when the wafer holding units 46 are not empty, the processed wafers W can be temporarily stored in the buffer 34.

Similarly, at step ST1, the cassette 15 carried by means of the bay carrying conveyer 11 is taken in the stocker 104 by the robot 104A of the stocker 104. The robot 104A transfers the wafers W within the cassette 15 to the wafer holding units 46 of the second single wafer carrying conveyer 120.

The second single wafer carrying conveyer 120 carries the wafers W to the intermediate product transfer unit 113. The intermediate product transfer unit 113 transfers the wafers to the processing apparatus 123 along the direction indicated by E as shown in FIG. 5.

The wafers W which have processed by the processing apparatus 123 are restored to the wafer holding units 46 along the direction indicated by E1 by means of the transfer robot 21. The operation of the transfer robot 21 and the function of the buffer 34 are similar to those of the transfer robot 21 and the buffer 34 in FIG. 2, and thus descriptions thereof will be omitted.

Accordingly, in the single wafer carrying step ST1, the wafers W are carried in a single wafer state to the processing apparatuses 23, 123 by means of the first single wafer carrying conveyer 20 or the second single wafer carrying conveyer 120, respectively. The processing apparatuses 23, 123 are apparatuses of which the processing capacity for the wafers W, that is, the number of processed wafers per unit time, is lower than that of the common processing apparatus 200.

Next, an intermediate product transfer step ST2 shown in FIG. 9 is performed.

In the intermediate product transfer step ST2, as shown in FIG. 6, the wafers W are transferred between the first single wafer carrying conveyer 20 and the common processing apparatus 200, and between the second single wafer carrying conveyer 120 and the common processing apparatus 200.

In FIG. 6, when the first single wafer carrying conveyer 20 carries the wafers W, the transfer robot 221 of the intermediate product transfer section 100 transfers the wafers W to the common processing apparatus 200 along the direction indicated by F.

In a common processing step ST3, the common processing apparatus 200 performs inspection of film thickness on the wafers W. In an intermediate product restoring step ST4, after the common processing apparatus 200 performs the inspection of film thickness on the wafers W, the transfer robot 221 transfers and restores the wafers W from the common processing apparatus 200 to the wafer holding units 46 along the direction indicated by F1.

Similarly, in the intermediate product transfer step ST2, when the second single wafer carrying conveyer 120 shown in FIG. 6 carries wafers W, the transfer robot 221 of the intermediate product transfer section 103 transfers the wafers W to the common processing apparatus 200 along the direction indicated by G.

In the common processing step ST3, the common processing apparatus 200 performs inspection of film thickness on the wafers W. In the intermediate product restoring step ST4, after the common processing apparatus 200 completes the inspection of film thickness on the wafers W, the transfer robot 221 transfers and restores the wafers W to the wafer holding units 46 along the direction indicated by G1.

The buffer 234 in FIG. 6 has the function of temporarily storing the wafers W, similarly to the buffer 34 shown in FIGS. 2 and 5.

As described above, the intermediate product transfer step ST2, the common processing step ST3 and the intermediate product restoring step ST4 shown in FIG. 9 are performed.

In the common processing step ST3, the common processing apparatus 200 takes in and processes in common the wafers W from the first single wafer carrying conveyer 20 or the wafers W from the second single wafer carrying conveyer 120. The common processing apparatus 200 can process a greater number of wafers W per unit time than the processing apparatuses 23, 123 shown in FIG. 1. Therefore, the common processing apparatus 200 can be used effectively in common by providing the common processing apparatus between two single wafer carrying conveyers 20, 120.

In addition, one common processing apparatus 200 is suitable for two single wafer carrying conveyers 20, 120, and thus the intermediate product transfer sections 100, 103 and the common processing apparatus 200 can be arranged between the single wafer carrying conveyers 20, 120. Therefore, the footprint area for installing the intermediate product manufacturing apparatus 10 shown in FIG. 1 can be reduced, it is possible to accomplish the miniaturization of the intermediate product manufacturing apparatus 10. Furthermore, since the number of apparatuses can be reduced, the capital investment can be reduced.

SECOND EMBODIMENT

Figure 10:
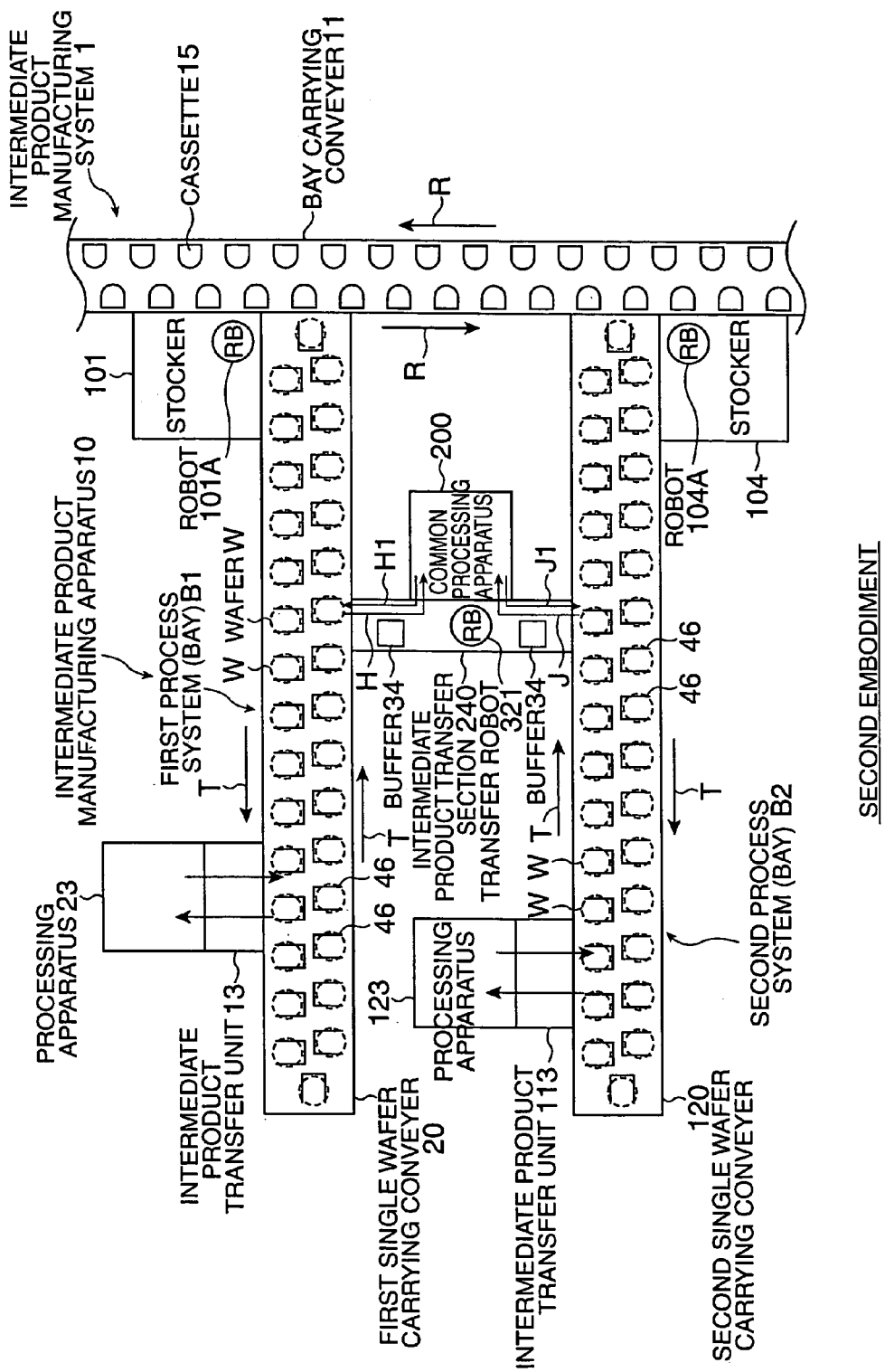
FIG. 10 is a plan view of an intermediate product manufacturing system including a second embodiment of the intermediate product manufacturing apparatus according to the present invention.

FIG. 10 shows the intermediate product manufacturing system 1 including a second embodiment of the intermediate product manufacturing apparatus according to the present invention.

The intermediate product manufacturing apparatus 10 shown in FIG. 10 is different in the structure of the intermediate product transfer section 240 from the intermediate product manufacturing apparatus 10 shown in FIG. 1. The other structures of the intermediate product manufacturing apparatus 10 shown in FIG. 10 are similar to the corresponding structures of the intermediate product manufacturing apparatus 10 shown in FIG. 1, and thus descriptions thereof will be omitted.

The intermediate product transfer section 240 of the intermediate product manufacturing apparatus 10 shown in FIG. 10 has a structure, for example, similar to the intermediate product transfer section 100 or 103 shown in FIG. 1.

However, one intermediate product transfer section 240 is provided, not two intermediate product transfer sections. The intermediate product transfer section 240 is provided between a side of the first single wafer carrying conveyer 20 and a side of the second single wafer carrying conveyer 120.

The intermediate product transfer section 240 has one transfer robot 321 and preferably a buffer 34, similarly to the intermediate product transfer units 100, 103 shown in FIG. 6. The transfer robot 321 can transfer the wafers W in the direction indicated by H or H1 between the wafer holding units 46 of the first wafer carrying conveyer 20 and the common processing apparatus 200.

Similarly, the transfer robot 321 can transfer the wafers W in the direction indicated by J or J1 between the wafer holding units 46 of the second single wafer carrying conveyer 120 and the common processing apparatus 200. The common processing apparatus 200 is, for example, a film thickness inspecting apparatus.

By employing the above structure, one intermediate product transfer section 240 is sufficient, and thus it is possible to accomplish miniaturization of the intermediate product manufacturing apparatus 10.

THIRD EMBODIMENT

Figure 11:
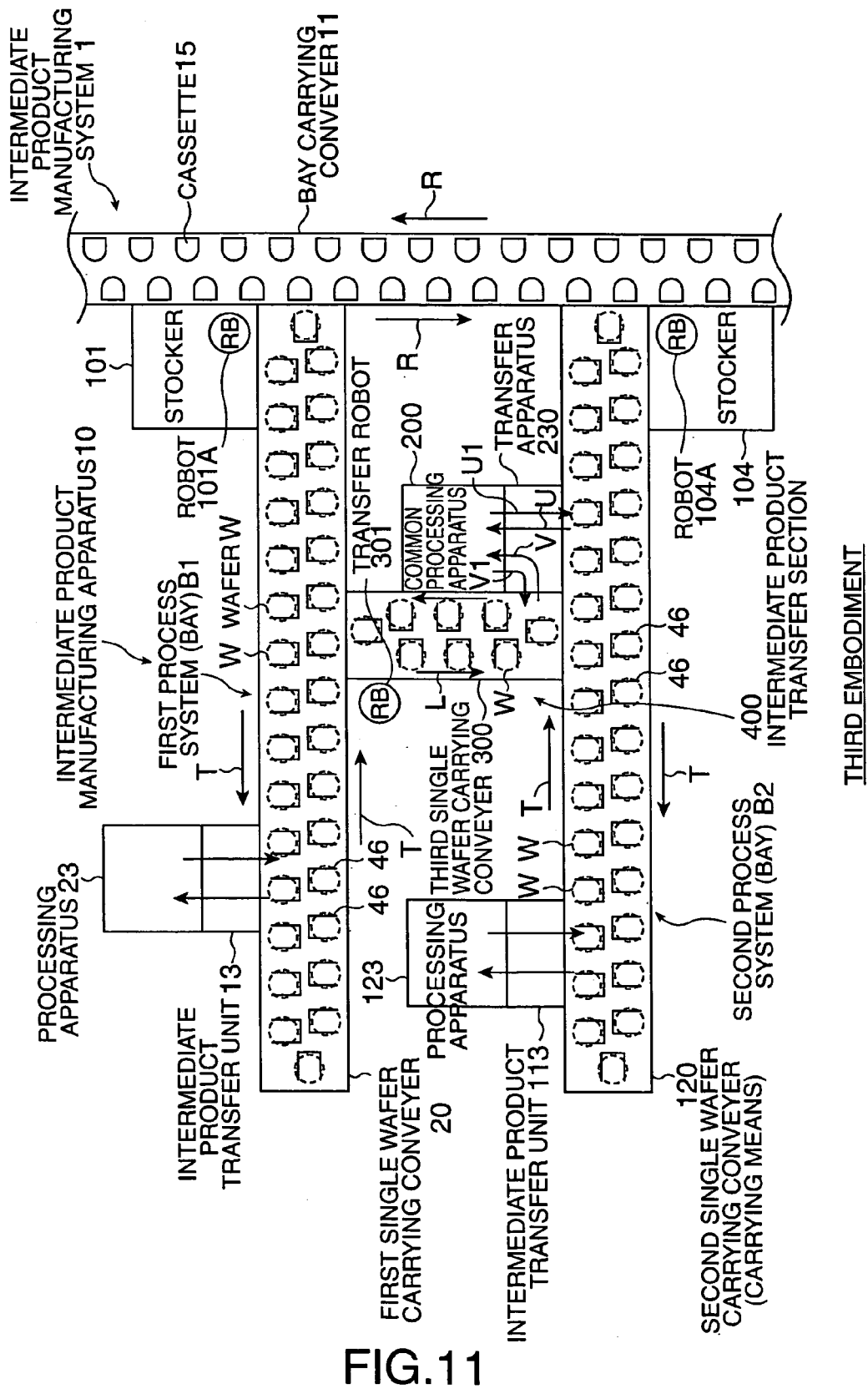
FIG. 11 is a plan view of an intermediate product manufacturing system including a third embodiment of the intermediate product manufacturing apparatus according to the present invention.

FIG. 11 shows the intermediate product manufacturing system 1 including a third embodiment of the intermediate product manufacturing apparatus according to the present invention.

The intermediate product manufacturing apparatus 10 shown in FIG. 11 is different from the intermediate product manufacturing apparatus 10 shown in FIG. 1 in the following respect.

In FIG. 11, a third single wafer carrying conveyer 300 is provided between the side portion of the first single wafer carrying conveyer 20 and the side portion of the second single wafer carrying conveyer 120. An intermediate product transfer section 400 in FIG. 11 has the third single wafer carrying conveyer 300 and an intermediate product transfer apparatus 230.

The third single wafer carrying conveyer 300 has a plurality of wafer holding units 46. Each wafer holding unit 46 can be carried continuously in carrying direction indicated by L.

The third single wafer carrying conveyer 300 has the transfer robot 301. The transfer robot 301 is a robot for transferring the wafers W between the wafer holding units 46 of the first single wafer carrying conveyer 20 and the wafer holding units 46 of the third single wafer carrying conveyer 300. The transfer robot 301 has a structure similar to, for example, the transfer robot 21 shown in FIG. 3. The transfer apparatus 230 is similar to, for example, the intermediate product transfer section 100 or 103 shown in FIG. 6.

The transfer apparatus 230 can transfer the wafers W in the direction indicated by U or U1 between the common processing apparatus 200 and the wafer holding units 46 of the second single wafer carrying conveyer 120.

The third single wafer carrying conveyer 300, the transfer robot 301 and the transfer apparatus 230 transfer the wafers W between the wafer holding units 46 of the first single wafer carrying conveyer 20 and the common processing apparatus 200. In this case, the transfer apparatus 230 can transfer the wafers W in the direction indicated by V or V1 between the third single wafer carrying conveyer 300 and the common processing apparatus 200.

Accordingly, in the first embodiment shown in FIG. 1, the respective wafers W coming from the first single wafer carrying conveyer 20 and the second single wafer carrying conveyer 120 can be subjected to the inspection of film thickness in common by means of the common processing apparatus 200, after having been processed in the processing apparatus 23 or the processing apparatus 123.

In this case, without using the bay carrying conveyer 11, the first single wafer carrying conveyer 20 and the second single wafer carrying conveyer 120 can directly transfer the wafers W between the common processing apparatus 200 and the first and second single wafer carrying conveyers.

In the second embodiment shown in FIG. 10, one intermediate product transfer section 240 is connected to the first single wafer carrying conveyer 20 and the second single wafer carrying conveyer 120. Therefore, one intermediate product transfer section 240 can directly transfer the wafers W between the first single wafer carrying conveyer 20 and the common processing apparatus 200, and between the second single wafer carrying conveyer 120 and the common processing apparatus 200. The second embodiment has a less significant change in the specification of the intermediate product manufacturing system 1 than the first embodiment, so that the second embodiment may be more realistic.

The third embodiment shown in FIG. 11 has a less significant change in the specification of the intermediate product manufacturing system 1 than the second embodiment shown in FIG. 10, so that the third embodiment may be the most realistic.

By employing the embodiments of the intermediate product manufacturing apparatus according to the present invention, an apparatus having a sufficient margin of processing capacity such as the common processing apparatus 200 can be provided between a plurality of single wafer carrying conveyers for use in common. Therefore, it is possible to reduce the number of processing apparatuses, compared with a case where an apparatus having a high processing speed is provided for every single wafer carrying conveyer.

Since the common processing apparatus and the intermediate product transfer section is provided between the plurality of single wafer carrying conveyers, it is possible to accomplish miniaturization of the footprint area of the intermediate product manufacturing apparatus and the intermediate product manufacturing system.

The wafers W on the first single wafer carrying conveyer and the wafers W on the second single wafer carrying conveyer can be directly carried to and inspected by the common processing apparatus 200, not via the bay carrying conveyer 11. Then, after the inspection, the wafers W can be directly restored to the corresponding single wafer carrying conveyer.

As a result, the manufacturing and processing efficiency of the wafers W, which are the intermediate products, can be enhanced, so that it is possible to reduce the time required for carrying the wafers W. Therefore, it is possible to reduce the intermediate product manufacturing time.

In the embodiments of the present invention, the semiconductor wafers W are used as an example of the intermediate products. However, the intermediate products are not limited to this and, for example, substrate wafers for use in a small-sized or large-sized liquid crystal display device may be used as the intermediate products.

The transfer robots 21, 221, 301, 321, 101A, 104A are robots having arms. The transfer robots may be robots employing a method of being horizontally moved and transferring the wafers. The number of robots may be one, as shown in the figures, or may be two or more.

Figure 12:
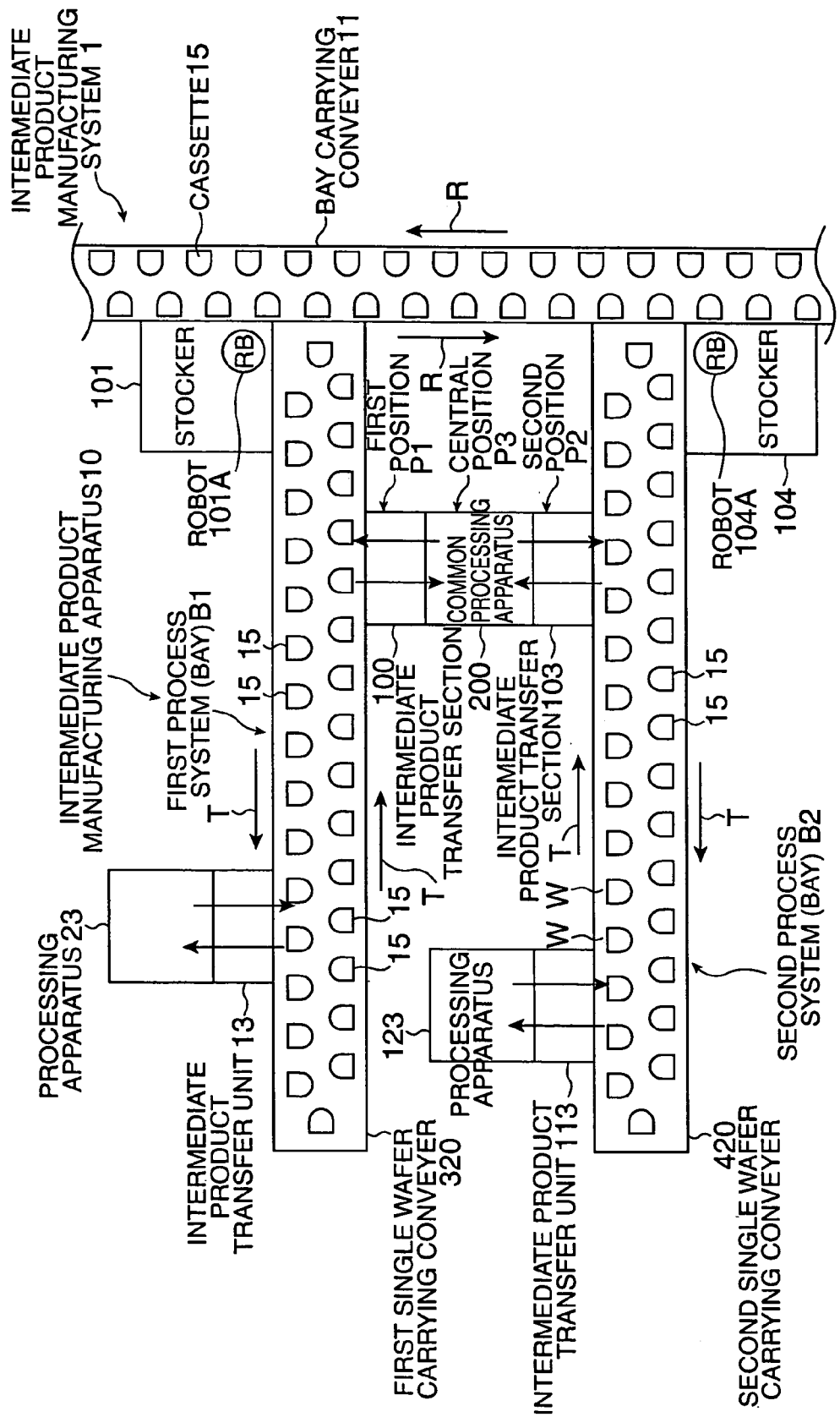
FIG. 12 is a plan view of an intermediate product manufacturing system including a fourth embodiment of the intermediate product manufacturing apparatus according to the present invention.

FIG. 12 shows the intermediate product manufacturing system including a fourth embodiment of the intermediate product manufacturing apparatus according to the present invention.

This intermediate product manufacturing apparatus 10 comprises a first carrying means 320 and a second carrying means 420, unlike the intermediate product manufacturing apparatus 10 shown in FIG. 1. Since the other elements of the intermediate product manufacturing system 1 shown in FIG. 12 are similar to the corresponding elements of the intermediate product manufacturing system 1 shown in FIG. 1, the same reference numerals are used and descriptions thereof will be omitted.

The first carrying means 320 and the second carrying means 420 in FIG. 12 have the same structure. Unlike the first single wafer carrying conveyer 20 and the second single wafer carrying conveyer 120 shown in, for example, FIG. 1, the first carrying means 320 and the second carrying means 420 are not an apparatus for carrying the wafers W in a single wafer state. That is, the first carrying means 320 and the second carrying means 420 can continuously carry one or more wafers W as a unit in a cassette 15 in the carrying direction indicated by T, similarly to the bay carrying conveyer 11. The first carrying means 320 and the second carrying means 420 mount a plurality of cassettes 15 thereon so that the cassettes can be carried in the carrying direction indicated by T. Each cassette 15 detachably stores one or more wafers W as shown in FIG. 2.

Accordingly, the first carrying means 320 and the second carrying means 420 may carry one or more wafers W as a unit in a cassette 15.

The present invention is not limited to the aforementioned embodiments, but a variety of modifications can be made thereto without departing from the appended claims.

In the respective constructions of the above embodiments, some elements may be omitted or combined arbitrarily unlike the above descriptions.

The intermediate product manufacturing apparatus according to the present invention may be used in assembly processes of various products. In the respective embodiments, an automatic carrying vehicle such as OHS (Over Head Shuttle) or OHT (Over Head Transport) may be used, in place of the bay carrying conveyer.

What is claimed is:

1. An intermediate product manufacturing apparatus for carrying intermediate products and processing the intermediate products with a first processing apparatus and a second processing apparatus, the intermediate product manufacturing apparatus comprising:
   a first carrier for carrying the intermediate products in a single wafer state to the first processing apparatus;
   a second carrier, arranged in parallel with the first carrier, for carrying the intermediate products in a single wafer state to the second processing apparatus;
   a common processing apparatus provided between the first and second carriers, for carrying out a common process on the intermediate products carried by the first and second carriers in the single wafer state;
   a first intermediate product transfer section with a first transfer robot provided between the first carrier and the common processing apparatus, for transferring the intermediate products between the common processing apparatus and the first carrier;
   a second intermediate product transfer section with a second transfer robot provided between the second carrier and the common processing apparatus, for transferring the intermediate products between the common processing apparatus and the second carrier; and
   an inter-process carrying conveyor for carrying a plurality of cassettes between the first and second carriers, each cassette configured to detachably house a plurality of the intermediate products;
   wherein each of the first and second carriers has a first side, for carrying the intermediate products away from the inter-process carrying conveyor, connected to a second side, for carrying the intermediate products towards the inter-process carrying conveyor;

wherein the first processing apparatus is arranged and located alongside the first side of the first carrier and includes a third transfer robot for transferring intermediate products between the first side of the first carrier and the first processing apparatus;

wherein the second processing apparatus is arranged and located alongside the second side of the second carrier and includes a third transfer robot for transferring intermediate products between the second side of the second carrier and the second processing apparatus;

wherein the common processing apparatus is arranged and located alongside the second side of each of the first and second carriers; and wherein the common processing apparatus has a higher processing capacity than the first and second processing apparatuses.

2. The intermediate product manufacturing apparatus according to claim 1, wherein the carriers comprise single wafer carrying conveyors for carrying the intermediate products in a single wafer state.

3. The intermediate product manufacturing apparatus according to claim 1,
wherein the intermediate products comprise semiconductor wafers.

4. An intermediate product manufacturing method for carrying intermediate products and processing the intermediate products with first and second processing apparatuses, the method comprising:
 a carrying step in which the intermediate products are carried in a single wafer state to the processing apparatuses through first and second carriers;
 an intermediate product transfer step in which an intermediate product transfer section provided between the first and second carriers transfers the intermediate products in a single wafer state between a common processing apparatus and the first and second carriers;
 a common processing step in which a common process is performed on the intermediate products carried by the first and second carriers to the common processing apparatus provided between the plurality of carriers; and
 an inter-process carrying step in which the intermediate products are carried by an inter-process carrying conveyor between the first and second carriers in a cassette configured to detachably house a plurality of intermediate products;

wherein the carrying step includes carrying the intermediate products away from the inter-process carrying conveyor on a first side of each of the first and second carriers and carrying the intermediate products towards the inter-process carrying conveyor on a second side of each of the first and second carriers, the first side being connected to the second side;

wherein the first processing apparatuses is arranged and located alongside the first side of the first carrier;

wherein the second processing apparatus is arranged and located alongside the second side of the second carrier; and wherein the common processing apparatus is arranged to face the second side of each of the first and second carriers.

5. The intermediate product manufacturing method according to claim 4,
wherein the carriers comprise single wafer carrying conveyors for carrying the intermediate products in the single wafer state, and the intermediate products comprise semiconductor wafers.

* * * * *